United States Patent [19]
Telser et al.

[11] Patent Number: 6,040,116
[45] Date of Patent: *Mar. 21, 2000

[54] PHOTOSENSITIVE RECORDING ELEMENT HAVING A RECORDING LAYER AND A TOP LAYER POSSESSING DIFFERENT SOLUBILITY PROPERTIES, AND ITS DEVELOPMENT IN ONE OPERATION

[75] Inventors: Thomas Telser, Weinheim; Wolfgang Huemmer, Limburgerhof; Karl-Rudolf Kurtz, Heidelberg, all of Germany

[73] Assignee: BASF Aktiengesellschaft, Ludwigshafen, Germany

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/892,350

[22] Filed: Jul. 14, 1997

Related U.S. Application Data

[62] Continuation of application No. 08/692,640, Aug. 5, 1996, abandoned, which is a continuation of application No. 07/752,488, filed as application No. PCT/EP90/00407, Mar. 14, 1990.

[30] Foreign Application Priority Data

Mar. 17, 1989 [DE] Germany .............................. 39 08 763
Mar. 14, 1990 [WO] WIPO ...................... PCT/EP90/00407

[51] Int. Cl.$^7$ ....................................................... G03F 7/32
[52] U.S. Cl. ........................ 430/306; 430/273.1; 430/331
[58] Field of Search ................................ 430/273.1, 331, 430/309, 306

[56] References Cited

U.S. PATENT DOCUMENTS

| | | | |
|---|---|---|---|
| 4,401,749 | 8/1983 | Hoffmann et al. | 430/271.1 |
| 4,459,348 | 7/1984 | Jun et al. | 430/271.1 |
| 4,590,144 | 5/1986 | Schornick et al. | 430/273.1 |
| 4,600,679 | 7/1986 | Browne et al. | 430/162 |
| 4,716,098 | 12/1987 | Mack et al. | 430/331 |
| 4,847,182 | 7/1989 | Worns et al. | 430/309 |
| 4,877,715 | 10/1989 | Koch et al. | 430/271.1 |
| 4,891,301 | 1/1990 | Aldag et al. | 430/281.1 |
| 4,916,045 | 4/1990 | Koch et al. | 430/270.1 |
| 4,994,344 | 2/1991 | Kurtz et al. | 430/273.1 |
| 5,176,986 | 1/1993 | Telser et al. | 430/306 |

FOREIGN PATENT DOCUMENTS

| 0225676 | 6/1987 | European Pat. Off. | 430/306 |
|---|---|---|---|

OTHER PUBLICATIONS

*The Merck Index* 9th Ed, Merck & Co, Inc, NJ (1976) p. 923.
Grant & Hackh's Chemical Dictionary, 5th Ed, McGraw–Hill Book Co (1987) pp. 100, 220, 284, 366.

*Primary Examiner*—Janis L. Dote
*Attorney, Agent, or Firm*—Keil & Weinkauf

[57] ABSTRACT

A novel photosensitive recording element having a dimensionally stable substrate (A), a photopolymerizable relief-forming recording layer (B), which may consist of two or more individual layers (B), and an optically transparent top layer (C) firmly adhering to the surface of (B) is used for the production of a flexographic relief printing plate. Imagewise exposure of the photopolymerizable relief-forming recording layer (B) of the novel photosensitive recording element to actinic light results in a difference between the solubilities of its exposed and unexposed parts, so that its unexposed parts can be washed out (developed) with a solvent. On the other hand, the optically transparent top layer (C) of the novel photosensitive recording element is insoluble or nonswellable in the relevant solvent. The imagewise exposed novel photosensitive recording element can nevertheless be developed in one operation with the aid of an emulsion of the water-in-oil or oil-in-water type. These emulsions are also suitable for developing imagewise exposed photosensitive recording elements whose photopolymerizable relief-forming recording layer (B) consist of two or more individual layers (B) having different solubility properties. In this case too, development is effected in one operation.

8 Claims, No Drawings

PHOTOSENSITIVE RECORDING ELEMENT HAVING A RECORDING LAYER AND A TOP LAYER POSSESSING DIFFERENT SOLUBILITY PROPERTIES, AND ITS DEVELOPMENT IN ONE OPERATION

This application is a continuation of application Ser. No. 08/692,640, filed on Aug. 5, 1996, now abandoned; which is a continuation of application Ser. No. 07/752,488, filed on Sep. 10, 1991, now abandoned which was filed as PCT/EP90/00407 on Mar. 14, 1990.

The present invention relates to a novel photosensitive recording element having dimensionally stable substrate (A), a photopolymerizable relief-forming recording layer (B), which consists of a single layer (B) or of two or more individual layers (B), and an optically transparent top layer (C) firmly adhering to the surface of (B). The novel photosensitive recording element is used for the production of a flexographic relief printing plate.

The present invention furthermore relates to a novel process for the production of flexographic relief printing plates from this novel photosensitive recording element or from known photosensitive recording elements.

Photosensitive recording elements having a dimensionally stable substrate (A), a photopolymerizable relief-forming recording layer (B), which consists of a single layer (B) or of two or more individual layers (B), and an optically transparent top layer (C) firmly adhering to the surface of (B) are disclosed in, for example, U.S. Pat. Nos. 2,760,863, 4,323,636, 4,369,246, 4,323,637, DE-B-21 23 702, U.S. Pat. No. 3,990,897 (DE-A-24 44 118), U.S. Pat. No. 4,162,919 (DE-A-24 56 439), DE-A-28 15 678, DE-A-28 23 300, DE-A-28 30 662, DE-A-29 39 989, U.S. Pat. No. 4,320,188 (DE-A-29 42 183), DE-A-30 12 841, EP-B- 0 084 851 (U.S. Pat. Nos. 4,460,675, 4,427,759, GB-B-1 366 769), EP-A-0 185 337 (U.S. Pat. No. 4,622,088), EP-A-0 133 265 and EP-A-0 183 552 or are described in the prior German Patent Applications P 37 36 980.6, P 38 03 457.3 and P 38 33 650.2.

This wealth of prior art known since 1956 shows clearly that, regardless of whether the imagewise exposed relief-forming recording layer (B) of the known photosensitive recording element is developed with organic or aqueous solvents, the optically transparent top layer (C) firmly adhering to the surface of the relevant recording layer (B) is always soluble or swellable in the particular solvents used for development, so that it is washed away with the parts of the recording layer (B) which have not been exposed and are therefore still soluble or swellable in the solvents. If this were not the case, it would necessitate a separate operation during development of the known imagewise exposed recording elements, which has always been avoided to date for evident reasons relating to cost-efficiency, required time and additional cost of apparatuses.

Although top layers (C) which are soluble or swellable both in organic and in aqueous solvents are mentioned in one breath in many of the patents mentioned above by way of example, no disclosed example uses an optically transparent top layer (C) which would have been insoluble or non-swellable in the particular solvent for the imagewise exposed relief-forming recording layer (B).

Thus, although a photosensitive recording element which has a photopolymerizable relief-forming recording layer (B) and which is used for the production of flexographic relief printing plates is disclosed in EP-A-0 059 385, said publication gives no indication that this recording layer (B) can be combined with an optically transparent layer (C) having completely different solubility.

All this indicates that a photosensitive recording element whose photopolymerizable relief-forming recording layer (B) and whose optically transparent top layer (C) firmly adhering to the surface of (B) and having different solubility properties is in principle not regarded as meeting practical requirements by those skilled in the art.

This is furthermore not altered by EP-A-O 162 691, since the latter does not disclose a photosensitive recording element for the production of flexographic relief printing plates but merely describes a recording element which is used for the production of a lithographic printing plate. Its recording layer, which has a thickness of not more than 3.23 $\mu$m, is a photocrosslinkable but nonphotopolymerizable diazo layer, as conventionally used in the area of lithographic printing plates or offset printing plates. This diazo layer is developed with water after imagewise exposure. It is covered with a top layer of O-epoxyalkylated tetrakis-(hydroxyphenyl)-ethane resins which is oleophilic but water-permeable. During development with water, the parts of the top layer which are present on the unexposed parts of the diazo layer are removed altogether with the latter parts. This improves the differentiation between the hydrophilic substrate surface bared imagewise by development (the nonimage parts) and the oleophilic image parts, resulting in an improvement in the printing properties of the lithographic printing plate or offset printing plate.

On the other hand, in the case of flexographic relief printing plates whose printing relief layer is particularly thick, such differentiation of the printing surface typical of offset plates is neither intended nor desirable. Furthermore, owing to the thickness of the photopolymerizable recording layer (B) of the photosensitive recording element for the production of flexographic relief printing plates, the amounts of material which have to be washed out during their development are considerably greater than can ever be the case in the development of recording elements for the production of lithographic offset printing plates. These two fundamental differences between the area of flexographic relief printing plates on the one hand and that of lithographic offset printing plates on the other mean that solutions in one ares are not relevant for the other area and are also not considered by those skilled in the art. Thus, there would be no desire to further complicate the production of a flexographic relief printing plate, in which a great deal of material in any case has to be washed away, by additionally applying to the photopolymerizable relief-forming recording layer (B) a top layer (C) which is insoluble in the developer.

The purpose of applying an optically transparent top layer (C) to a photopolymerizable relief-forming recording layer (B) is to prevent the photographic negative used for imagewise exposure from adhering to the surface of the photopolymerizable relief-forming recording layer (B). Furthermore, said top layer (C) is used for protecting the photopolymerizable relief-forming recording layer (B) from the inhibiting effect of atmospheric oxygen and/or the deposition of dirt particles.

In the photosensitive recording elements know to date, an optically transparent or opaque cover sheet (D), which as is known, is peeled off from the optically transparent top layer (C) prior to imagewise exposure, is usually present on the optically transparent top layer (C). For this purpose, the optically transparent top layer (C) must have an exactly graded differentiation in adhesion so that it adheres more firmly to the surface of the photopolymerizable relief-forming recording layer (B) than to the surface of the cover sheet (D) when the cover sheet (D) is peeled off.

Furthermore, the optically transparent top layer (C) must have a good barrier effect with respect to the readily diffusing and/or readily evaporating low molecular weight constituents of the photopolymerizable relief-forming recording layer (B), so that these to molecular weight constituents do not escape from the recording layer (B) and thus do not adversely change the performance characteristics of said recording layer and those of the top layer (C). For example, if the low molecular weight constituents of the photopolymerizable relief-forming recording layer (B) are too highly compatible with the optically transparent top layer (C), such a large amount of, for example photopolymerizable olefinically unsaturated monomers and photopolymerization initiators can migrate into the optically transparent top layer (C) that this layer itself becomes photopolymerizable to a certain degree and, after imagewise exposure of the relief-forming recording layer (B), can no longer be washed away from its exposed parts. On the other hand, such large amounts of low molecular weight additives, such as plasticizers, dyes, antioxidants or antiozonants, can diffuse into the optically transparent top layer (C) that the latter suffers a disadvantageous change in its optical transparency, its tensile strength, its flexibility and/or its exactly graded differentiation in adhesion. However, the diffusion of all these low molecular weight constituents can also result in the loss of the barrier effect of the optically transparent top layer (C) with respect to atmospheric oxygen. It is precisely the loss of flexibility, of tensile strength and of the good adhesion to the photopolymerizable relief-forming recording layer (B) which frequently leads to tearing and/or to delamination of the optically transparent top layer (C). This is a great disadvantage particularly when the photosensitive recording elements are to be clamped on printing cylinders before being exposed imagewise.

It is possible, to a certain degree, to overcome these problems and disadvantages in a given known photosensitive recording element by varying the optically transparent top layer (C). In the view of those skilled in the art, however, the choice of suitable optically transparent top layers (C) has been greatly restricted to date because the only optically transparent top layers (C) and photopolymerizable relief-forming recording layers (B) which should be combined with one another in the photosensitive recording elements are those which are soluble or swellable in the same solvents. However, the fulfillment of this proviso, which is considered to be a fundamental one, requires that the constituents of the optically transparent top layers (C) are similar in their physicochemical properties to the constituents, in particular the polymeric binders, of the photopolymerizable relief-forming recording layer (B), which helps to cause and/or to reinforce the abovementioned undesirable diffusion processes because a chemically similar environment is present in both layers (B) and (C) and there is a concentration gradient between the layers.

It is an object of the present invention to provide a novel photosensitive recording element having a dimensionally stable substrate (A), a photopolymerizable relief-forming recording layer (B), which consists of a single layer (B) or of two or more individual layers (B), and an optically transparent top layer (C) firmly adhering to the surface of (B). Said recording element is intended to be used for the production of a flexographic relief printing plate and should not have the prior art disadvantages described above. It is a further object of the present invention to provide novel processes for the production of flexographic relief printing plates from photosensitive recording elements, which permit washout (development) of the image wise exposed recording elements in one operation.

We have found that these objects are achieved, surprisingly, by the combination of a photopolymerizable relief-forming recording layer (B), which consists of a single layer (B) or of two or more individual layers(B) and in which a difference between the solubility of its exposed and unexposed parts arises during imagewise exposure to actinic light, so that its unexposed parts can be washed out with a certain solvent, with an optically transparent top layer (C) which is not soluble or swellable in the relevant solvent. In view of the fact that this combination was generally regarded as unsuitable by those skilled in the art, the achievement of the object according to the invention was all the more surprising.

Accordingly, the present invention relates to a photosensitive recording element for the production of a flexographic relief printing plate, having a dimensionally stable substrate (A), a 0.1–7 mm thick photopolymerizable relief-forming recording layer (B), which consists of a single layer (B) or of two or more individual layers (B) and in which a difference between the solubilities of its exposed and unexposed parts arises during imagewise exposure to actinic light, so that its unexposed parts all together or the unexposed parts of its uppermost individual layer (B) can be washed out (developed) with a certain solvent, and an optically transparent top layer (C) adhering firmly to the surface of (B), wherein the optically transparent top layer (C) is not soluble or swellable in the solvent for the unexposed parts of the recording layer (B).

The present invention furthermore relates to a novel process for the production of a flexographic relief printing plate, wherein a photosensitive recording layer of the above-mentioned type is used and washout (development) of the imagewise exposed recording element is carried out with the aid of an emulsion in one operation.

The novel photosensitive recording element for the production of a flexographic relief printing plate, having a dimensionally stable substrate (A), a photopolymerizable relief-forming recording layer (B), which consists of a single layer (B) or of two or more individual layers (B), and an optically transparent top layer (C) firmly adhering to the surface of (B) is referred to below as novel recording element for the sake of brevity.

The novel process for the production of a flexographic relief printing plate having a photopolymerized relief layer from the novel recording element is referred to below as novel process for short. The novel process can also be used for the production of a flexographic relief printing plate from a known photosensitive recording element.

The two components of the novel recording element which are essential to the invention are the photopolymerizable relief-forming recording layer (B), which may consist of a single layer (B) or of two or more individual layers (B) and in which a difference between the solubilities of its exposed and unexposed parts arises during imagewise exposure to actinic light, so that is unexposed parts all together or the unexposed parts of it uppermost individual layer (B) can be washed out (developed) with a certain solvent, and the optically transparent top layer (C) which is not soluble or swellable in the relevant solvent.

In this novel combination of a photopolymerizable relief-forming recording layer (B) and an optically transparent top layer (C), which have different solubility properties, said recording layer (B) or the uppermost individual layer (B) or it unexposed parts are soluble or swellable in organic solvents.

Both the photopolymerizable relief-forming recording layer (B) or uppermost individual layer (B) which is soluble or swellable in organic solvents and the corresponding ones which are soluble or swellable in water or aqueous solvents are known to consist of one or more polymers, as binders ($b_1$), which are soluble or swellable in the relevant solvents, one or more photopolymerization initiators ($b_2$), one or more olefinically unsaturated photopolymerizable monomers which are compatible with the polymer or polymers ($b_1$) and one or more assistants ($b_4$).

Examples of suitable photopolymerizable relief-forming recording layers (B) or uppermost individual layers (B) which can be developed with water or aqueous solvents and are intended for use in the novel recording element contain, as water-soluble or water-swellable binders ($b_1$), copolymers or ethylene with (meth)acrylic acid and vinyl esters, vinyl ethers, (meth)acrylates and/or (meth)acrylamides; maleated alkadiene polymers; alkadiene polymers modified by maleation and partial esterification or partial amidation in polymer-analogous reactions; copolymers of alkadienes with α,β-olefinically unsaturated carboxylic acids; carboxyl-containing alkadiene/acrylonitrile copolymers; partially or virtually completely hydrolyzed poly-(vinyl alkanecarboxylates), or partially or virtually completely hydrolyzed vinyl alkanecarboxylate/alkylene oxide graft copolymers, and are disclosed in, for example EP-A-0 224 164, EP-B-0 010 690 (U.S. Pat. No. 4,272,611), EP-A-0 183 552, DE-A-30 12 841 (U.S. Pat. No. 4,272,608), DE-A-35 40 950 (EP-A-0 223 114), DE-A-35 43 646 (EP-A-0 226 153), DE-A-36 02 472 (EP-A-0 231 002) or DE-A-37 18 447 (EP-A-0 293 750).

Examples of suitable photopolymerizable relief-forming recording layers (B) or uppermost individual layers (B) which can be developed with organic solvents and are intended for use in the novel recording element contain elastomers ($b_1$) which are soluble or swellable in organic solvents, such elastomers being polyalkadienes, alkadiene/acrylonitrile copolymers, vinyl aromatic/alkadiene copolymers, vinyl aromatic/alkadiene block copolymers, butyl rubbers, acrylate rubbers, polychloroprenes, fluorine rubbers, silicone rubbers polysulfide rubbers or ethylene/propylene/alkadiene copolymers.

Examples of suitable elastomers ($b_1$) which are soluble or swellable in organic solvents are polyalkadienes, vinyl aromatic/alkadiene copolymers, vinyl aromatic/alkadiene block copolymers, alkadiene/acrylonitrile copolymers or ethylene/propylene/alkadiene copolymers.

Examples of particular suitable elastomers ($b_1$) of this type are natural rubber, the homopolymers of butadiene or of isoprene, butadiene/isoprene copolymers, copolymers of styrene and butadiene and/or isoprene having a random distribution of polymerized monomers and preferably containing from 10 to 50% by weight of polymerized styrene, the vinyl aromatic/alkadiene block copolymers, the butadiene/acrylonitrile copolymers containing from 15 to 40% by weight of acrylonitrile and the ethylene/propylene/alkadiene copolymers.

Examples of particularly suitable elastomers ($b_1$) which are soluble or swellable in organic solvents are the vinyl aromatic/alkadiene block copolymers which contain one or more elastomeric alkadiene polymer blocks X and one or more thermoplastic vinyl aromatic polymer blocks Y, the blocks X and Y generally being chemically bonded to one another via carbon-carbon bonds. In a given block copolymer, bonding of a block X to a block Y may also be effected by a random or an alternating copolymer which contains conjugated alkadienes and vinyl aromatics as polymerized units, or bonding of the blocks X and Y may be effected by means of a copolymer of conjugated alkadienes and vinyl aromatics, in which copolymer the concentration of polymerized vinyl aromatics increases.

Moreover, the particularly suitable block copolymers may be bonded to even larger block copolymer associations via suitable multivalent atoms or ions and inorganic, organic or organometallic moieties. Bonding is understood as meaning the formation of covalent or ionic bonds between tow moieties.

Furthermore, some or all of the olefinic and aromatic bonds or of only the olefinic in the alkadiene polymer blocks X may be hydrogenated. In addition, the blocks X and Y may contain further polymerized monomers, which need not be conjugated alkadienes and vinyl aromatics, for example acrylonitrile, acrylic acid, maleic anhydride, (meth) acrylamides or (meth)acrylates, and their amount in the block copolymer should not in general exceed 10% by weight. Blocks X may also contain polymerized vinyl aromatics, the amount of which being chosen so that is does not adversely affect the elastomeric properties of the blocks X. The blocks Y amy also contain polymerized conjugated alkadienes in an amount such that their thermoplastic processibility is not lost.

If a given particularly suitable block copolymer contains a plurality of elastomeric blocks X and/or a plurality of thermoplastic blocks Y, the blocks X or Y need not be chemically identical or almost identical but may differ substantially from one another provided that they all have the required elastomeric or thermoplastic properties.

In general, blocks X have a glass transition temperature Tg of less than 20° C., preferably less than 0° C., in particular less than −15° C. These blocks can generally have an average molecular weight of from $10^3$ to $2 \cdot 10^5$. In general, they contain from 30 to 100, in particular from 30 to 95% by weight, based on the particular block X, of polymerized conjugated alkadienes.

Blocks Y generally have a glass transition temperature Tg of more than 20° C. and an average molecular weight of from $1.5 \cdot 10^3$ to $2 \cdot 10^6$, preferably from $5 \cdot 10^3$ to $1.5 \cdot 10^6$, in particular from $10^4$ to $1.2 \cdot 10^6$. They generally contain from 30 to 100, in particular from 40 to 90% by weight, based on the particular block Y, of polymerized vinyl aromatics.

Examples of advantageous conjugated alkadienes are butadiene, isoprene, pentan-1,3-diene [sic], 2,3-dimethylbutadiene or hexa-2,4-diene, butadiene and isoprene being preferred.

Examples of advantageous vinyl aromatics are styrene, α-methylstyrene, p-methylstyrene, p-tert-butyl-styrene and 1vinylnaphthalene, styrene being preferred.

Examples of particularly advantageous block copolymers are the thermoplastic elastomeric three-block copolymers Y-X-X', in which Y is a thermoplastic, non-resilient styrene polymer block, X is an elastomeric butadiene and/or isoprene polymer block and X' is an elastomeric polymer block which differs from X and consists of polymerized butadiene and/or isoprene and, if required, polymerized styrene.

Further examples of particularly advantageous block copolymers are block copolymers having the composition X-Y-X-Y, Y-X-X'-Y, Y-XY-X', or X-X'-Y-X.

Further examples of particularly suitable elastomers ($b_1$) which are soluble or swellable in organic solvents are ethylene/propylene/alkadiene copolymers which have an ethylene content of from 40 to 80% by weight, contain from 2 to 20 olefinic double bonds of 1,000 carbon atoms and advantageously contain butadiene, isoprene, penta-1,4-diene, hexa-2,4-diene, hepta-1,4diene, dicyclopentadiene and/or ethylidenenorbornene as polymerized units.

Both the particularly suitable photopolymerizable relief-forming recording layers (B) or uppermost individual layers (B) which can be developed with organic solvents and the particularly suitable photopolymerizable relief-forming recording layers (B) or uppermost individual layers (B) which can be developed with water or aqueous solvents, which layers are intended for use in the novel.l recording element, advantageously consist of

- (b$_1$) from 20 to 99% by weight of one or more of the abovementioned elastomers which are soluble or swellable either in organic solvents or in water or aqueous solvents, as binders,
- (b$_2$) from 0.001 to 10% by weight of one or more photopolymerization initiators,
- (b$_3$) from 1 to 60% by weight of one or more olefinically unsaturated photopolymerizable monomers which are compatible with the particular elastomer or elastomers (b$_1$) and
- (b$_4$) from 0 to 40% by weight of one or more assistants.

Examples of suitable photopolymerization initiators (b$_2$), olefinically unsaturated photopolymerizable monomers (b$_3$) and assistants (b$_4$) for photopolymerizable relief-forming recording layers (B) or uppermost individual layers (B) which can be developed either with water or aqueous solvents or with organic solvents are conventional and known and are disclosed in, for example, the prior art cited at the outset.

The photopolymerizable relief-forming recording layers (B) are 0.1 to 7 mm, in particular from 0.7 to 6.5 mm, thick.

The optically transparent top layer (C) to be used according to the invention is from 0.2 to 25 μm thick and covers, completely and in uniform thickness, the photopolymerizable relief-forming recording layer (B) present underneath it, or its uppermost individual layer (B). It is transparent to light and thus does not interfer with the imagewise exposure of the photopolymerizable relief-forming recording layer (B) to actinic light. It is not soluble or swellable in the solvents with which the imagewise exposed relief-forming recording layer (B) or it uppermost individual layer (B) is washed out. In general, it is impermeable to oxygen and thus prevents inhibition of photopolymerization by atmospheric oxygen in the photopolymerizable relief-forming recording layer (B). It is nontacky, so that an image-bearing mask or photographic negative placed on it can easily be removed again from the novel recording element. Advantageously, it adheres to the surface of the photopolymerizable or imagewise exposed relief-forming recording layer (B) more firmly than to any cover sheet (D) present on it.

The optically transparent top layer (C) may be smooth, i.e. may have a surface roughness $R_{max} \leq 0.1$ μm. Advantageously it is matt, i.e. its surface roughness $R_{max}$ is from 0.1 to 15 μm, preferably from 0.3 to 10 μm, in particular from 0.5 to 7 μm. m The matt finish results in a considerable reduction in the time in which the image-bearing mask or photographic negative can be brought into contact with the novel recording element.

If the thickness of the optically transparent top layer (C) is smaller than it surface roughness $R_{max}$, the surface of the photopolymerizable relief-forming recording layer (B) underneath the optically transparent top layer (C) is likewise matt, which is often advantageous.

The optically transparent top layer (C) mainly contains a polymer which is capable of forming strong films, or said top layer consists of such a polymer. The choice of the polymer for the production of the optically transparent top layer (C) depends primarily on the solubility properties of the polymer on the one hand and on the photopolymerizable relief-forming recording layer (B) to be covered therewith, or the uppermost individual layer (B) of said recording layer, on the other hand: according to the invention, the solubilities must be matched with one another so that the photopolymerizable relief-forming recording layer (B) or its uppermost individual layer (B) or the polymeric binder (b$_1$) present therein, on the one hand, and the optically transparent top layer (C), on the other hand, are not soluble or swellable in one and the same solvent.

Examples of suitable optically transparent top layers (C) to be used according to the invention and their solubility parameters are generally known and are disclosed in, for example, the prior art cited at the outset.

Examples of suitable polymers to be used according to the invention for optically transparent top layers (C) which are soluble or swellable in organic solvents are polyamides, copolyamides, polyethylene, polystyrene, styrene/acrylonitrile copolymers, polyvinyl chloride, vinyl chloride/vinyl acetate copolymers, polycarbonates, silicone rubbers, polyesters, polyurethanes, poly(meth)acrylates, cyclized rubbers having a high degree of cyclization, ethylene/propylene copolymers and ethylene/vinyl acetate copolymers.

Examples of suitable polymers to be used according to the invention for optically transparent top layers (C) which are soluble or swellable in water or in aqueous solvents, are partially or virtually completely hydrolyzed poly(vinyl alkanecarboxylates), partially or virtually completely hydrolyzed alkanecarboxylate/-polyalkylene oxide graft copolymers, gelatine, cellulose esters, cellulose ethers polyvinylpyrrolidone, vinyl aromatic/alkanedicarboxylic anhydride copolymers, vinyl ether/alkanedicarboxylic anhydride copolymers, poly(meth)acrylic acid, (meth)acrylic acid/(meth)acrylate copolymers and polyalkylene oxides.

The optically transparent top layer (C) which is soluble or swellable in water or in aqueous solvents may further more be composed of suitable low molecular weight compounds which are soluble in water or aqueous solvents. Examples of suitable compounds are saponines and saccharides.

Examples of particularly suitable polymers to be used according to the invention for the optically transparent top layer (C) which is soluble or swellable in water or in aqueous solvents are the partially or virtually completely hydrolyzed poly(vinyl alkanecarboxylates) and/or the partially or virtually completely hydrolyzed vinyl alkanecarboxylate/polyalkylene oxide graft copolymers, of which partially or virtually completely hydrolyzed polyvinyl acetate or propionate having a degree of hydrolysis of from 60 to 99%, preferably from 70 to 98% by weight, in particular from 75 to 95%, and a number average molecular weight $M_n$ of from $10^4$ to $10_5$, in particular from $1.5 \cdot 10^4$ to $5 \cdot 10^4$, and the partially or virtually completely hydrolyzed ethylene oxide/vinyl acetate and the ethylene oxide/vinyl propionate graft copolymer, which are obtainable by grafting vinyl acetate or propionate onto polyethylene oxide and subsequent hydrolysis and contain from 10 to 30% by weight of polymerized ethylene oxide, are very particularly suitable.

The novel recording elements can accordingly comprise the following novel combinations:

Combination 1:

A photopolymerizable relief-forming recording layer (B) which can be developed with organic solvents and is an individual layer (B) and an optically transparent top layer (C) which is soluble or swellable in water or in aqueous solvents.

Combination 2:

A photopolymerizable relief-forming recording layer (B) which consists of two or more individual layers (B), at least the individual layer (B) present directly underneath the top layer (C), i.e. the uppermost individual layer (B), being capable of being developed with organic solvents, and an optically transparent top layer (C) which is soluble or swellable in water or in aqueous solvents.

Combination 3:

A photopolymerizable relief-forming recording layer (B) which can be developed with water or with aqueous solvents and which is an individual layer (B) and an optically transparent top layer (C) which is soluble or swellable in organic solvents.

Combination 4:

A photopolymerizable relief-forming recording layer (B) which consists of two or more individual layers (B), at least the individual layer (B) present directly underneath the top layer (C), i.e. the uppermost individual layer (B), being capable of being developed with water or aqueous solvents and an optically transparent top layer (C) which is soluble or swellable in organic solvents.

The novel recording elements which comprise the novel combination 1 or the novel combination 4 are very particularly advantageous according to the invention.

Another essential component of the novel recording element is the dimensionally stable substrate (A). Sheets, films or conical or cylindrical sleeves of metals, such as steel, aluminum, copper or nickel, or of plastics, such as polyethylene terephthalate, polybutylene terephthalate, polyamide or polycarbonate, can be used as dimensionally stable substrates (A). Woven fabrics and nonwovens, for example woven glass fibers, or composite materials of, for example, glass fibers and plastics, such as polyethylene terephthalate, are also suitable.

The dimensionally stable substrate (A) in turn may have a flexible and resilient lower layer underneath. Furthermore, an adhesion-promoting layer, by means of which an adhesive bond is achieved between (A) and (B), may be present between the dimensionally stable substrate (A) and the photopolymerizable relief-forming recording layer (B). However, it is also possible, and in some cases, advantageous, if said recording layer (B) is bonded to said substrate (A) in such a way that the former can readily be removed from the latter.

The adhesion-promoting layers used are advantageously conventional and known, about 0.5–40 μm thick adhesion-promoting layers.

If highly reflective sheets or films are used as dimensionally stable substrates (A), they may contain suitable antihalation agents, such as carbon black or manganese dioxide. The antihalation agents can, however, also be applied as a separate layer on the dimensionally stable substrate (A) or may be present in the adhesion-promoting layer or in the photopolymerizable relief-forming recording layer (B).

Furthermore, the novel recording element may contain an optically transparent or opaque cover sheet (D) which can be readily detached from the optically transparent top layer (C).

The cover sheets (D) are usually from 10 to 150 μm, thick. The essentially consist of plastics, textile materials, papers or metals. That surface of the cover sheet (D) which is directly adjacent to the optically transparent top layer (C) is smooth, i.e. it has a surface roughness $R_{max}$ of $\leq 0.1$ μm, or it is matt, i.e. it has a surface roughness of $R_{max}$ of from 0.1 to 15 μm, preferably from 0.3 to 10 μm, in particular from 0.5 to 7 μm. If the cover sheet (D) is matt, its roughness pattern is impressed in the optically transparent top layer (C) and may also be impressed in the surface of the photopolymerizable relief-forming recording layer (B). This smooth or matt surface of the cover sheet (D) may furthermore be provided with an antiadhesive finish, i.e. it may have, for example, a 0.1–0.5 μm thick antiadhesion layer of conventional and known silicones or of other plastics, such as polyethylene or polypropylene. Top layers (D) of textile materials or of paper may furthermore be impregnated with plastics, such as urea/formaldehyde resins or polyolefins. The top layers (D) of plastics may furthermore be biaxially oriented. It is often advantageous, prior to the biaxial orientation, to apply a 0.1–0.5 μm thick layer of, for example, a vinylidene chloride copolymer to that side of (D) which is subsequently directly adjacent to the optically transparent top layer (C).

The production of the novel recording element has no special technical features but is carried out by the conventional and known methods for the production of photopolymerizable relief-forming layers and top layers and by the conventional and known methods for the production of films of plastics, textile materials, papers or metals.

Thus, the photopolymerizable relief-forming recording layers (B) or the individual layers (B) are usually produced by mixing the components $(b_1)$, $(b_2)$, $(b_3)$ and $(b_4)$ described above, by means of a conventional kneading, mixing or dissolution method and by shaping the resulting photopolymerizable mixtures (B) into photopolymerizable, relief-forming recording layers (B) or individual layers (B) by casting from solution, hot pressing, calendaring or extrusion. The production of said recording layer (B) may be carried out separately or may be integrated in the process for the production of the novel recording element.

The optically transparent top layer (C) is usually produced by methods also suitable for the production of the photopolymerizable relief-forming recording layer (B), the production of said top layer (C) usually being integrated in the process for the production of the novel recording element.

The components of the cover sheets (D) which may be present are, provided that they consist of plastics, mixed by means of the conventional kneading, mixing or dissolution method and shaped into the corresponding films by casting from solution, hot pressing, calendaring, extrusion or blow molding. These operations, too, can be integrated in the process for the production of the novel recording element; usually, however, the cover sheets (D) are produced separately, wound on reels and used in this form for the production of the novel recording element.

Furthermore, the production of the novel recording element from its abovementioned components has no special technical features but is carried out in a conventional manner by bonding the photopolymerizable relief-forming recording layer (B) to the optically transparent top layer (C) and, if required, the cover sheet (D), and this too may be effected on the dimensionally stable substrate (A), with or without the use of an adhesion-promoting layer and a flexible and resilient lower layer. It is in principle possible first to bond said recording layer (B) to the dimensionally stable substrate (A) and then to cover its uncovered side with said top layer (C) and, if required, the cover sheet (D), or said recording layer (B) is first applied to the cover sheet (D) covered with the optically transparent top layer (C) and only then bonded to the dimensionally stable substrate (D). Of course, these operations may be carried out in a conventional and known continuous batchwise unit in succession or simultaneously.

Furthermore, the photopolymerizable relief-forming recording layer (B) may be produced from a plurality of individual layers (B). These individual layers (B) may have the same or roughly the same composition or different compositions. According to the invention, individual layers (B) having different compositions are preferred. A suitable process for the production of the photopolymerizable relief-forming recording layer (B) composed of photopolymerizable individual layer s(B) is disclosed in , for example, EP-A-0 084 851 or DE-A-29 42 183 (U.S. Pat. No. 4,320, 188) or is described in German Patent Application P 38 33 650.2.

Even in its production, the novel recording element has particular unexpected advantages which arise from the novel combination of photopolymerizable relief-forming recording layer (B) and an optically transparent top layer (C) having different solubility properties: for example, its optically transparent top layer (C) can advantageously be applied by casting from solution onto its already present photopolymerizable relief-forming recording layer (B) without in any way attacking the surface of said recording layer (B). Moreover, the novel recording element can be produced in units and apparatuses disclosed in the prior art, so that conversions of existing units and apparatuses or even further investment in novel units and apparatuses to be specially developed are dispensed with.

After its production, the novel recording element proves to be dimensionally stable and does not tend to exhibit cold flow. It is very particularly advantageous that the low molecular weight compounds present in its photopolymerizable relief-forming recording layer (B), such as the photopolymerizable olefinically unsaturated monomers ($b_3$), the photopolymerizable initiators ($b_2$) and the assistants ($b_4$), no longer diffuse to a troublesome extent into the optically transparent top layer (C) and escape from there into the atmospheres. Consequently, the novel recording element is completely or substantially odorless, so that no particular safety measures, such as powerful air extraction, are necessary when it is being handled. Furthermore, the optically transparent top layer (C) does not tend to form streaks or become turbid on prolonged storage but remains optically transparent and clear, so that the exposure properties of the novel recording element are not adversely affected. In addition, the optically transparent top layer (C) adheres firmly to the surface of said recording layer (B) and also does not tend to warp or crack when the novel recording element is bent. Even when the photosensitive recording element is cut to a size conventionally used in flexographic relief printing plates, no delamination of the optically transparent top layer (C) from the surface of the photopolymerizable relief-forming recording layer (B) is observed.

Moreover, the novel recording element has a substantially smaller tendency to become soiled as a result of deposition of dust particles in the air, so that it can readily be handled even without cover sheet (D) in the Reprographic Department and can also be stored for a relatively long time until it finally further processed to the flexographic relief print plate, giving the reprographic worker more latitude in scheduling the operations in his department.

The particular advantages of the novel recording element are also convincingly displayed when it is used for the production of flexographic relief printing plates.

It is known that the production of a flexographic relief printing plate from a photosensitive recording element comprises the following conventional operations:

(i) if required, pretreatment of the photosensitive recording element, (ii) removal of any cover sheet (D) present from the optically transparent top layer (C), (iii) placing of an image-bearing mask or photographic negative on the optically transparent top layer (C), (iv) imagewise exposure of the photopolymerizable relief-forming recording layer (B) to actinic light having a wavelength $\lambda$ of from 250 20 450 nm, in particular from 350 to 450 nm, (v) washing out (developing) the unexposed parts of the imagewise exposed relief-forming layer (B) by means of a suitable solvent, (vi) drying and (vii) if required, aftertreatment of the flexographic relief printing plate obtained in this manner or of its photopolymerized relief layer.

An example of the pretreatment is uniform exposure of the photopolymerizable relief-forming recording layer (B) from its back and/or front to actinic light.

Example of suitable aftertreatment methods are aftertreatment with bromine-containing solutions, uniform postexposure to actinic light having a wavelength $\lambda$ of from 250 to 450 nm and postexposure to light having wavelength $\lambda$ of less than 250 nm.

Example of suitable sources of actinic light were commercial UV fluorescent tubes, medium pressure, high pressure and low pressure mercury lamps, superactinic fluorescent tubes, pulsed xenon lamps, lamps doped with metal iodides, carbon arc lamps and sterilization lamps.

Examples of suitable organic solvents for the development are aliphatic or aromatic hydrocarbons, such as n-hexane, n-heptane, octane, cyclohexane, decalin, hexylcyclopentane, hexylcyclohexane, petroleum ether, naphtha, mineral spirits, mineral spirits from which aromatic constituents have been removed, synthetic isoparaffins, n-paraffins, hydrogenated mineral oils, petroleum fractions, hydrogenated oil fractions, limonene and other terpenes, xylene, ethylbenzene, the diethyl-substituted benzenes, n-butylbenzene, n-pentylbenzene, n-hexylbenzene and isopropylbenzene, and mixtures of these solvents; ketones, such as acetone, methyl ethyl ketone, ethyl butyl ketone and dibutyl ketone; ethers, such a diethyl ether, tetrahydrofuran, dioxane and di-n-butyl ether; esters, such as ethyl acetate, ethyl acetoacetate, hexyl, heptyl, octyl, nonyl, decyl, undecyl, dodecyl, lauryl, palmityl and oleyl acetate, dioctyl sebacate and dioctyl adipate; halogenated aliphatic hydrocarbons, such as methylene chloride, chloroform, trichloroethanes, trichloroethylene, tetrachloroethylene, dichlorotetrafluoroethane and trichlorotrifluoroethane; mixtures which contain two or more of these solvents; and mixtures which contain one or more of these solvents and additionally alcohols, such as methanol, ethanol, isopropanol, n-butanol, n-pentanol and/or n-hexanol; and solvents and mixtures of the stated type which additionally contain solid, liquid or gaseous organic and inorganic compounds, for example surfactants, in minor amounts. Of these organic solvents, particularly advantageous ones are those which are nonflammable or poorly flammable and/or high boiling, the term nonflammable indicating that the relevant solvents do not sustain combustion under the oxygen partial pressure of the air, the term poorly flammable indicating that the relevant solvents have a flashpoint of more than 45° C. according to DIN 51,755 or DIN 51, 758 and the term high boiling indicated a boiling point or boiling range of the relevant solvent of above 120° C., preferably 140° C., in particular 160° C.

Examples of suitable aqueous solvents in addition to water are aqueous solutions of lithium hydroxide, sodium hydroxide or potassium hydroxide or of lithium carbonate or bicarbonate, sodium carbonate or bicarbonate or potassium carbonate or bicarbonate or potassium carbonate or bicarbonate or of ammonia, which solutions may additionally contain minor amounts of solid, liquid or gaseous organic and inorganic compounds, for example other salts, complexing agents or surfactants.

The novel recording element can of course be used for the known process, described above in detail, for the production of a flexographic relief printing plate. However, because of the different solubility properties of its optically transparent top layer (C) on the one hand and of the unexposed and therefore nonpolymerized parts of its imagewise exposed relief-forming recording layer (B) or of its uppermost individual layer (B) on the other hand, it may be necessary to carry out the develoment in two operations, an organic solvent being used in one operation and water or an aqueous solvent being employed in the other operation.

According to the invention, however, it is very particularly advantageous to carry out development of the imagewise exposed novel recording element by means of the novel process for the production of a flexographic relief printing plate.

In the novel process, development is carried out in one operation, regardless of the different solubility properties of the optically transparent top layer (C) and of the unexposed and therefore nonpolymerized parts of the imagewise exposed relief-forming recording layer (B).

According to the invention, this is effected by the use of an emulsion of the water-in-oil or oil-in-water type as the sole developer.

The water-in-oil emulsion to be used according to the invention consists of a finely dispersed aqueous phase and a continuous nonflammable or poorly flammable and/or high boiling organic phase in a volume ratio of from 90:10 to 10:90, particularly advantageously from 60:40 to 40:60.

Suitable organic phases or components of the organic phase are all the abovementioned organic solvents which are water-immiscible and furthermore are poorly flammable and/or nonflammable and/or high boiling. Among these, tetrachloroethylene and the mineral spirits from which aromatic constituents have been removed are particularly advantageous, the latter being very particularly advantageous.

Moreover, the water-in-oil emulsion to be used according to the invention may contain from 0.1 to 20% by volume of one or more of the abovementioned alcohols and/or from 0.001 to 10% by volume of one or more of the surface-active compounds or of one or more surfactants or emulsifiers, the percentages being based on the total amount of said emulsion.

Examples of suitable emulsifiers are those which stabilize water-in-oil emulsions. Examples of very useful emulsifiers are condensates of fatty amines with ethylene oxide, condensates of alcohols with long-chain fatty acids and condensates of amino alcohols with long-chain fatty acids.

Examples of particularly suitable emulsifiers are adducts of glycerol, epichlorohydrin, oleyl alcohol and ethylene oxide, sorbitan monostearate and adducts of an amino alcohol and oleic acid.

The oil-in-water emulsion to be used according to the invention consists of a finely dispersed organic phase and a continuous aqueous phase in a volume ratio of 90:10 to 10:90, particularly advantageously from 60:40 to 40:60.

Suitable organic phases or components of the organic phase are all the abovementioned organic solvents which need not necessarily be poorly flammable or non-flammable and/or high boiling. However, the poorly flammable or nonflammable and/or high boiling solvents, such as tetrachloroethylene or the mineral spirits from which aromatic constituents have been removed, are advantageous.

The oil-in-water emulsion used according to the invention may also contain the abovementioned alcohols and/or surface-active compounds, such as surfactants or emulsifiers, in the abovementioned amounts, emulsifiers such as sodium dodecylhydrogensulfate, which stabilize oil-in-water emulsions, preferably being used here.

The particularly advantageous emulsion to be used in each case for the novel process can be selected in a simple manner: the choice is made on the basis of the solubility properties of the thickest layer to be developed which is present in a given novel recording element. For example, the imagewise exposed novel recording element which comprises the novel combination 1 or 2 is developed with the water-in-oil emulsion by the procedure particularly preferred according to the invention, whereas the imagewise exposed recording element which comprises the novel combination 3 or 4 is developed with the oil-in-water emulsion by the procedure particularly preferred according to the invention.

In the novel process, the water-in-oil or oil-in-water emulsion to be used according to the invention is prepared immediately before development of the imagewise exposed novel recording element in the brush or rotary washers conventionally used for development, by circulating the components of the emulsion by pumping.

The novel process and the flexographic relief printing plates produced from the novel recording element by means of the novel process have particular unexpected advantages.

In the novel process and the flexographic relief printing plates produced from the novel recording element by means of the novel process have particular unexpected advantages.

In the novel process, the use of the oil-in-water or water-in-oil emulsion eliminates may safety, ecological and toxicological problems which to date have always been associated with the use of conventional and known organic developers. Moreover, despite its high boiling organic phase, the oil-in-water or water-in-oil emulsion to be used according to the invention can be worked up in a simple manner by distillation under atmospheric pressure and reused.

Another particular surprising advantage of the novel process is that its use is not restricted only to the novel recording element; instead, it is also very suitable for the production of a flexographic relief printing plate from the photosensitive recording element which is described in German Patent Application P 38 33 650.2.

This photosensitive recording element contains a dimensionally stable substrate (A), a photopolymerizable recording layer (B), comprising two or more individual layers (B) having different solubility properties, and an optically transparent top layer (C) which adheres firmly to the surface of (B) and has the same solubility properties as the individual layer (B) directly underneath, i.e. the uppermost individual layer (B).

After its imagewise exposure to actinic light, this photosensitive recording element can be developed in one operation with the aid of the water-in-oil or oil-in-water emulsion described above and to be used according to the invention, the unexposed parts of the two or more individual layers (B) having different solubility properties and the optically transparent top layer (C) being washed out simultaneously.

In this version of the novel process, too, the choice of the particularly advantageous emulsion to be used in each case depends on the solubility properties of the thickest layer to be developed which is present in the photosensitive recording element.

The printing surface of the photopolymerizable relief layers of the flexographic relief printing plates produced by the novel procedure is of excellent quality. In particular, it no longer has surface structures in the form of frilling, worms or drop worms, i.e. orange peel, and polymer residues in the form of runs. Furthermore, the photopolymerized relief layers of the flexographic relief printing plates reproduce the subjects of the image-bearing mask or photographic negative completely faithfully. The relevant flexographic relief printing plates are therefore very suitable for the flexographic printing of continuous stationery and give excellent printed copies in particularly long print runs.

EXAMPLES AND COMPARATIVE EXPERIMENTS

EXAMPLE 1

Production of a novel recording element having a water-soluble optically transparent top layer (C), and further processing thereof to give a flexographic relief printing plate.

For the production of the water-soluble optically transparent top layer (C), 5 kg of a partially hydrolyzed vinyl acetate/ethylene oxide graft copolymer (MOWIOL® 04-M1 from Hoechst) were dissolved in 100 kg of tap water at 80° C. in the course of 2 hours. The resulting solution was filtered through a paper filter and then poured onto a 125 $\mu$m thick matt polyethylene terephthalate film (cover sheet D) so that, after drying for 15 minutes at 70° C., a uniform 4 $\mu$m thick of the MOWIOL® 04-M1 resulted.

For the production of the photopolymerizable relief-forming recording layer (B) which can be developed with organic solvents, a mixture of

- 43.5 kg of a styrene/isoprene/(styrene/butadiene) three block copolymers (elastomer $b_1$ soluble or swellable in organic solvents),
- 0.6 kg of benzil dimethyl acetal (photopolymerization initiator $b_2$),
- 2.5 kg of hexane-1,6-diol diacrylate (photopolymerizable olefinically unsaturated monomer $b_3$),
- 2.5 kg of liquid paraffin (assistant $b_4$),
- 0.6 kg of 2,6-di-tert-butyl-p-cresol (assistant $b_4$) and
- 0.0032 kg of the dye Solvent Black (C.I. 26,150) (assistant $b_4$) was extruded in a known manner. The throughput through the extruder was controlled in such a way that a 2,800 $\mu$m thick photopolymerizable relief-forming recording layer (B) was obtained.

For the production of the photopolymerizable relief-forming recording element, this photopolymerizable relief-forming recording layer (B) was introduced into the gap of a two-roll calender, over whose upper roll the laminate comprising the optically transparent top layer (C) and the cover sheet (D) was fed and over whose lower roll a 150 $\mu$m thick polyethylene terephthalate film (dimensionally stable substrate A) provided with a thin adhesion-promoting layer was introduced. the temperature of the calender rolls was 80° C. In the calender gap, components (A), (B), (C) and (D) were adhesively bonded to one another, after which the resulting novel recording element was cooled on a suction belt and cut to size. During cutting to size, no delamination of the optically transparent top layer (C) from the photopolymerizable relief-forming recording layer (B) was observed.

After storage for two days, the novel recording elements cut to size were preexposed from their back, i.e. through the dimensionally stable substrate (A), to actinic light for 30 seconds in a 100 watt exposure unit.

Thereafter, the cover sheet (D) was easily removed from the optically transparent top layer (C) without the novel recording elements cut to size acquiring a marked electrostatic charge. Said layer (C) remained intact and undamaged on the photopolymerizable relief-forming recording layer (B). When said recording elements were bent, their optically transparent top layer (C) remained undamaged; all that was observed was a very fine structure. The surface of said recording elements was uniformly matt and completely nontacky. The novel recording elements cut to size and free of the cover sheet could also be stored for a long time in the air before being further processed, without their performance characteristics being adversely affected. In particular, there was no annoying odor, no deposition of dirt particles, such as dust particles, and no turbidity of the optically transparent top layer (C).

In the production of flexographic relief printing plates, the novel recording elements cut to size and free of the cover sheet were placed in vacuum frames and, by reducing the pressure, were brought into intimate contact with the standard negatives placed on the optically transparent top layers (C). The contact between the standard negatives and the optically transparent top layers (C) was excellent. Thereafter, the novel recording elements were exposed imagewise to actinic light for 12 minutes with the aid of a flat-plate exposure unit. After the imagewise exposure, the standard negatives could be easily removed from the optically transparent top layers (C).

For the development of the imagewise exposed novel recording elements cut to size, 30 1 of a mineral spirit from which aromatic constituents had been removed (boiling range: 186–218° C.; flash-point according to DIN 51,755: 61° C.; aromatics content: <1%; content of naphthenic hydrocarbons: 35%; paraffin content: >64%, EXXSOL® D 60 from Esso) were initially taken in a drum-type brush washer having a capacity of 60 1. 30 1 of tap water were then added. The water-in-oil emulsion used for development was prepared therefrom by circulation of one minute by means of a pump. The flashpoint of the emulsion was 63° C. according to DIN 51,755, so that the drum-type brush washer could be operated without explosion protection. In addition, the emulsion was virtually odorless.

The imagewise exposed novel recording element cut to size were clamped in the drum-type brush washer and, immediately after the emulsion had been circulated by pumping, were washed out in the course of 10 minutes. The temperature of the emulsion was 20° C. The emulsion was used for development until its solids content was 5%.

After development, the resulting flexographic relief printing plates were carefully washed with pure mineral spirit from which aromatic constituents had been removed, until all water droplets had disappeared from the surface of its photopolymerized relief layers. The were then dried in a through-circulation dryer at 70° C. in the course of 2 hours. After being left to stand for 12 hours, the flexographic relief printing plates or their photopolymerized relief layers were aftertreated with an aqueous bromine solution and then postexposed to actinic light for 10 minutes.

The relief height of the flexographic relief printing plates obtained in this manner was 1200 $\mu$m. The printing surface of their photopolymerized relief layers was uniformly matt, nontacky and free of polymer residues in the form of runs and furthermore had no orange peel effect. In addition, the flexographic relief printing plates were completely odorless. Furthermore, their photopolymerized relief layers reproduce the subjects of the photographic negative completely faithfully and showed no damage in the form of fragmentation or underwashing.

The flexographic relief printing plates were clamped on printing cylinders and used for printing continuous stationery in a conventional, known flexographic printing unit using conventional, known flexographic printing inks. Excellent printed copies were obtained in particularly long print runs.

During the development of the imagewise exposed novel recording elements cut to size, contamination of the waste air with organic material was also measured and was multiplied by the amount of air extracted per hour. The emission values obtained therefrom were well below statutory emission limits.

The spent emulsion having a solids content of 5% by weight could be virtually completely worked up by distillation under atmospheric pressure at from 98 to 100° C. Almost 53 l were recovered from 60 l of originally used emulsion. The distillate was clear and consisted of two phases. The volume ratio of organic phase to water was 0.76. The lacking 7 l of mineral spirit from which aromatic constituents had been removed was replenished, after which the two phase mixture could be reused for development after being circulated by pump.

EXAMPLE 2

Production of a novel recording element having a water-soluble optically transparent top layer (C), and further processing thereof to give a flexographic relief printing plate.

Example 1 was repeated, except that the temperature of the emulsion was kept constant at 30° C. with the aid of a thermostat during the development process. After a washout time of only 5 minutes in each case, flexographic relief printing plates with photopolmerized relief layers having relief height of 1200 μm were obtained. The particular advantages described in detail in Example 1 were also obtained in this case. Furthermore, the amount of solvent emitted during the development process was 0.3 kg/h and hence still an order of magnitude lower than the statutory emission limit of 3 kg/h.

EXAMPLE 3

Production of a novel recording element having a water-soluble optically transparent top layer (C), and further processing thereof to five a flexographic relief printing plate.

Example 1 was repeated, except that the partially hydrolyzed vinyl acetate/ethylene oxide graft copolymer MOWIOL® GE 5-97 from Hoechst was used instead of MOWIOL® 04-M1, the optically transparent top layer (C) was 2 μm thick and the cover sheet (D) had a smooth surface.

The same advantages as in Example 1 were obtained, except that the surface of the novel recording elements cut to size and free of the cover sheet was completely smooth so that every defect, even small ones, in the surface could have been detected immediately. However, there were no surface defects at all.

COMPARATIVE EXPERIMENT 1

Production of a known photosensitive recording element having an optically transparent top layer (C) which is soluble in organic solvents, and further processing thereof to give a flexographic relief printing plate in a known manner.

Example 1 was repeated, except that, instead of the water-soluble optically transparent top layer (C) used there, a 5 μm thick optically transparent top layer (C) consisting of the alcohol-soluble polyamide MACROMELT® 6900 from Henkel was used, and the known photosensitive recording elements cut to size and free of the cover sheet were exposed imagewise to actinic light and then developed with the conventional, known organic solvent mixture consisting of tetrachloroethylene/n-butanol in a volume ratio of 8:2.

Compared with the novel recording elements of Examples 1 to 3, the known photosensitive recording element had may disadvantages: for example, the cover sheet (D) exhibited very much poorer adhesion to the optically transparent top layer (C), so that it showed delamination up to 1 cm from the edge when the known photosensitive recording element was cut to size. The optically transparent top layer (C) itself formed a pronounced, clearly visible structure in it surface when the known photosensitive recording element or said element cut to size was bent.

The solvent mixture had an unpleasant odor and was also toxic, so that expensive ventilation of the drum-type brush washer and treatment of the waste air were necessary. Furthermore, the flashpoint of the solvent was 51° C. according to DIN 51,755 and hence 10° C. lower than in the case of the emulsions of Examples 1 to 3, so that caution was required when handling it. Moreover, the amount of solvent emitted was 3 kg/h and thus 10 times higher than the statutory emission limit of 0.3 kg/h. Although the developer could be worked up by distillation under atmospheric pressure, this did not compensate for the abovementioned disadvantages.

Furthermore, the flexographic relief printing plates obtained in this manner had an extremely unpleasant odor, and the printing surface of their photopolymerized relief layers had a pronounced orange peel effect. These disadvantages also could not be compensated by the fact that the photopolymerized relief layers had a relief height of 1400 μm after a development time of only 10 minutes.

EXAMPLE 4

Production of a novel recording element having a water-soluble optically transparent top layer (C), and further processing thereof to give a flexographic relief printing plate.

Example 1 was repeated, except that, instead of the emulsion describe there, a water-in-oil emulsion consisting of 29 l of tetrachloroethylene, 1 l of limonene and 30 l of water was used for development. The advantages described in detail in Example 1 were therefore obtained in this case too, whereas the disadvantages of Comparative Experiment 1 did not occur.

Moreover, it was found that the desorbate from the active carbon filters of the waste air treatment unit of the drum-type brush washer separated into the organic phase and the aqueous phase after standing for a short time, so that the tetrachloroethylene could easily be separated off and disposed of or reused.

EXAMPLE 5

Production of a novel recording element having a water-soluble optically transparent top layer (C), and further processing thereof to give a flexographic relief printing plate.

Example 1 was repeated, except that the photopolymerizable relief-forming recording layer (B) had been produced not from the components $(b_1)$, $(b_2)$, $(b_3)$ and $(b_4)$ stated in Example 1 but from 80 kg of the ethylene/propylene/alkadiene rubber BUNA® AP 241 from Hüls GmbH (ethylene content: 50% by weight; double bond content: 8 double bonds per 1,000 carbon atoms) $(b_1)$, 1 kg of benzil dimethyl acetal ($b_2$), 5 kg of isobornyl acrylate ($b_3$), 5 kg of dihydrocyclopentadienyl acrylate ($b_3$), 5 kg of di-n-octyl adipate ($b_4$), 0.01 kg of Siccoflush D(C.I. 74,260) and 0.5 kg of 2,6-di-tert-butyl-p-cresol.

In this case too, the advantages described in detail in Example 1 were obtained. The particularly good adhesion of the optically transparent top layer (C) to the photopolymerizable relief-forming recording layer (B), the advantageously short time of only 5 minutes in which the imagewise exposed novel recording elements cut to size could be washed out to a relief height of 1,200 μm and the extremely high resistance of the flexographic relief printing plates obtained in this manner to flexographic printing inks having ethyl acetate or ketones were striking.

EXAMPLE 6

Production of a novel recording element whose photopolymerizable recording layer (B) consists of two individual layers (B) having different solubility properties and which contains an optically transparent cover sheet (C) which is soluble or swellable in organic solvents, and further processing thereof to give a flexographic relief printing plate.

The novel recording element was produced by coextrusion in the manner described below.

The photopolymerizable mixture ($b_1$) used for the production of the individual layer ($B_1$) consisted of 81.8% by weight of a three-block rubber having the composition styrene/isoprene/styrene (CARIFLEX® 1107 from Shell AG), 1.2% by weight of benzil dimethyl acetal ($b_2$), 2.0% by weight of 2,6-di-tert-butyl-p-cresol ($b_4$), 5.0% by weight of hexane-1,6-diol diacrylate ($b_3$) and 10.0% by weight of liquid paraffin (white oil S 5000, $b_4$). The photopolymerizable mixture ($B_1$) was prepared in a conventional, known manner in a twin-screw devolatilization extruder and was transported therein as a molten material stream ($B_1$) to a two-layer coextrusion die. The maximum temperature of the molten material stream ($B_1$) was 155° C., the throughput was 30 kg/hour and the residence time in the extruder was 5 minutes. Before entering the two-layer coextrusion die from below, the molten stream ($B_1$) passed through a 40 μm metal fabric filter.

The photopolymerizable mixture ($B_2$) used for production of the individual layer ($B_2$) consisted of 71.497% of a terpolymer of 58% by weight of ethylene, 21% by weight of acrylic acid and 21% by weight of 2-ethylhexyl acrylate ($b_1$), 6% by weight of glycidyl methacrylate ($b_3$), 15% by weight of n-butylbenzenesulfonamide (CETAMOIL® BMB from BASF AG, ($b_4$), 5% by weight of butylethanolamine ($b_4$) combined with 0.003% by weight of SAFRANINE T (C.I. 50,240) ($b_4$) and 0.5% by weight of 2,6-di-tert-butyl-p-cresol ($b_4$). It was prepared separately from the photopolymerizable mixture ($b_1$) in a twin-screw devolatilization extruder and transported as a molten material stream ($B_2$) to the two-layer coextrusion die. The maximum temperature of the molten material stream ($B_2$) is 140° C., the throughput was 10 kg/hour and the residence time in the extruder was 7 minutes. Before entering the two-layer coextrusion die from above, the molten material stream ($B_2$) passed through a 40 μm metal fabric filter.

The melt flow indices of the material streams ($B_1$) and ($B_2$) were determined separately in a conventional, known manner under a weight of 0.6 kg according to DIN 53,735. The material stream ($B_1$) having a melt flow index of 2 g/10 minutes at 150° C. proved to be more highly viscous than the material stream ($B_2$) having a melt flow index of 100 g/10 minutes at 150° C. The material stream ($B_2$) accordingly had a melt flow index which was a factor of 15 higher than that of material stream ($B_1$).

The two molten material streams ($B_1$) and ($B_2$) were combined in a two-layer coextrusion dies, the molten materials treat ($B_1$) being fed in from below and molten material stream ($B_2$) being introduced from above. The two material streams ($B_1$) and ($B_2$) were extruded as 33.5 cm wide molten sheet-like structures ($B_1$) and ($B_2$) one on top of the other at a die temperature of 145° C. and immediately thereafter introduced into the gap of a calender, the less viscous molten sheet-like structure ($B_2$) forming the bead. The residence time between combining the molten sheet-like structures ($B_1$) and ($B_2$) which lay one on top of the other and entry into the calender gap was 30 seconds. The temperature of the calender rolls was 80° C.

Together with said sheet-like structures ($B_1$) and ($B_2$), a substrate film (dimensionally stable substrate A) coated with a mixture of adhesive-forming components was introduced into the calender gap, on the side of sheet-like structure ($B_1$), and a cover sheet (D) laminated with a top layer (C) was introduced into said gap, on the side of the sheet-like structure ($B_2$). 125 μm thick biaxially oriented polyethylene terephthalate films were used as cover sheets and substrate films. In their function as cover sheet (D), they were located on one side with a 5 μm thick layer of a conventional, known cyclized rubber having a high degree of cyclization (top layer (C). In their function as substrate film (A), they were provided on one side with 5 μm thick polyurethane adhesion-promoting layer.

During calendering in the calender gap, the molten sheet-like structures ($B_1$) and ($B_2$) one on top of the other were shaped into the 2,100 μm thick individual layer ($B_1$) and into the 700 μm thick individual layer ($B_2$), the two individual layers ($B_1$) and ($B_2$) simultaneously being adhesively bonded to one another to give the photopolymerizable recording layer (B). The overall result was that the novel recording element, in which the 125 μm thick substrate film (A), the 5 μm thick adhesion-promoting layer, the 2,100 μm thick individual layer ($B_1$), the 700 μm thick individual layer ($B_2$), the top layer (C) and the cover sheet (D) were one on top of the other in the stated order, the two individual layers ($B_1$) and ($B_2$) together forming the photopolymerizable recording layer (B).

The novel recording element could readily be cut to size without delamination of the top layer (C) from the uppermost individual layer ($B_2$) or separation of the cover sheet (D) from the top layer (C)> The cover sheets (D) could be removed from the top layers (C) of the novel recording elements cut to size, without damage to the top layer (C) or marked electrostatic charging. When the novel recording elements cut to size and free of the cover sheet were bent, their optically transparent top layer (C) remained undamaged; only a very fine structure appeared.

The novel recording elements cut to size and free of the cover sheet were further processed to flexographic printing plates as described in Example 1, except that an oil-in-water emulsion was used instead of the water-in-oil emulsion of Example 1. This oil-in-water emulsion consisted of 30 l of the mineral spirit of Example 1 from which aromatic constituents had been removed, as finely dispersed organic phase, 30 l of aqueous 1% strength sodium carbonate solution as the continuous aqueous phase and 0.1% by weight, based on the emulsion, of the emulsifier sodium dodecylhydrogensulfate.

Surprisingly, the imagewise exposed novel recording elements cut to size could be washed out to a relief height of 1,500 µm in the course of 10 minutes with the aid of the oil-in-water emulsion. Furthermore, the printing surface of the photopolymerized relief layers of the flexographic relief printing plates obtained in this manner had neither residues of top layer material (D) or an orange peel effect and free of runs. This means that both the top layer (C) which is soluble or swellable in organic solvents and consists of cyclized rubber and the unexposed parts of the individual layer ($B_2$), which parts can be developed with aqueous solvents, and the unexposed parts of the individual layer ($B_1$) which parts can be developed with organic solvents, has been washed out in one operation.

Otherwise, the flexographic relief printing plates produced in this manner had extremely good printing characteristics and gave excellent printed copies faithful to the original in long print runs.

The spent emulsion, as in the case of that of Example 1, could be worked up by distillation under atmospheric pressure and then reused after the addition of the emulsifier.

COMPARATIVE EXPERIMENT 2

Production of a conventional photosensitive recording element whose photopolymerizable relief-forming recording layer (B) consists of two individual layers (B) having different solubility properties and which contains a water-soluble optically transparent top layer (C), and further processing thereof to give a flexographic relief printing plate by a known process.

Example 6 was repeated, except that the top layer (C) of the vinyl acetate/ethylene oxide graft copolymer MOWIOL® 04-M1 from Hoechst was used instead of the top layer (C) of cyclized rubber and development was carried out using 60 l of aqueous 1% strength sodium carbonate solution.

It was found that the imagewise exposed photo-sensitive recording elements cut to size could be washed out only to a relief height of 700 µm, i.e. as far as the individual layer ($B_1$) which can be developed with organic solvents. The unexposed parts of the individual layer ($B_1$) were still present, and the developed recording elements could not be used for flexographic printing without additional process steps.

EXAMPLE 7

Production of a conventional photosensitive recording element whose photopolymerizable relief-forming recording layer (B) consists of two individual layers (B) having different solubility properties and which contains a water-soluble optically transparent top layer (C), and further processing thereof to give a flexographic relief printing plate by the novel process.

Comparative Experiment 2 was repeated, except that the oil-in-water emulsion of Example 6 was used instead of the aqueous 1% strength sodium carbonate solution.

Both the top layer (C) and the unexposed parts of the individual layer ($B_2$), which parts can be developed with aqueous solvents, and the unexposed parts of the individual layer ($B_1$), which parts can be developed with organic solvents, could be washed out in one operation, a relief height of 1,500 µm being achieved after a washout time of 10 minutes.

The flexographic relief printing plates produced in this manner had an excellent printing surface and could be used for flexographic printing without additional development steps being necessary.

What is claimed is:

1. A process for the production of a flexographic relief printing plate having a photopolymerized relief layer from a photosensitive recording element comprising (A) a dimensionally stable substrate, (B) a photopolymerizable relief-forming recording layer, which comprises a single layer or two or more individual layers, and (C) an optically transparent top layer, wherein the optically transparent top layer (C) firmly adheres to the surface of the recording layer (B), said process comprising:
(1) imagewise exposure of the photopolymerizable relief-forming recording layer (B) to actinic light, with the result that there is a difference between the solubilities of the exposed and unexposed parts of the recording layer (B),
(2) washout (development) of the optically transparent top layer (C) and of the unexposed and therefore nonphotopolymerized parts of the imagewise exposed relief-forming recording layer (B) with a developer with formation of the photopolymerized relief layer, wherein
development (process step 2) is carried out in one operation using a water-in-oil emulsion as the sole developer,
the water-in-oil emulsion consists of an aqueous phase and an organic phase,
the organic phase consists of a solvent selected from the group consisting of n-hexane, n-heptane, octane, cyclohexane, hexylcyclohexane, petroleum ether, naphtha, mineral spirits, mineral spirits from which aromatic constituents have been removed, synthetic isoparaffins, n-paraffins, hydrogenated mineral oils, petroleum fractions, hydrogenated oil fractions, xylene, ethylbenzene, diethyl-substituted benzenes, n-butylbenzene, n-pentylbenzene, n-hexylbenzene, isopropylbenzene, ketones, halogenated aliphatic hydrocarbons, a mixture of two or more of these solvents, and a mixture of one or more of these solvents with alcohol and/or minor amounts of surfactant, and
the optically transparent top layer (C) is soluble in aqueous solvents but insoluble in the organic phase suitable and effective for developing the layer (B), and the unexposed parts of the recording layer (B) are insoluble in aqueous solvents.

2. The process of claim 1, wherein the organic phase consists of a hydrogenated mineral oil or a halogenated aliphatic hydrocarbon.

3. The process of claim 1, wherein the organic phase consists of tetrachloroethylene or mineral spirits from which aromatic constituents have been removed.

4. The process of claim 1, wherein the organic phase consists of mineral spirits from which aromatic constituents have been removed.

5. The process of claim 1, wherein the organic phase has a boiling point or boiling range above 120° C.

6. The process of claim 1, wherein the water-in-oil emulsion contains from 0.1 to 20% by volume alcohol and from 0.001 to 10% by volume surfactant, the percentages being based on the total amount of the emulsion.

7. The process of claim 1, wherein the aqueous phase of the water-in-oil emulsion consists essentially of water.

8. The process of claim 1 wherein the water-in-oil emulsion contains from 0.001 to 10% by volume of surfactant based on the total amount of said emulsion.

* * * * *